(12) United States Patent
Jang

(10) Patent No.: US 7,648,876 B2
(45) Date of Patent: Jan. 19, 2010

(54) FLASH MEMORY DEVICE

(75) Inventor: Jeong-Yel Jang, Gyeonggi-do (KR)

(73) Assignee: Dongbu HiTek Co., Ltd., Seoul (KR)

( * ) Notice: Subject to any disclaimer, the term of this patent is extended or adjusted under 35 U.S.C. 154(b) by 0 days.

(21) Appl. No.: 11/849,744

(22) Filed: Sep. 4, 2007

(65) Prior Publication Data

US 2008/0054338 A1   Mar. 6, 2008

(30) Foreign Application Priority Data

Sep. 6, 2006   (KR) ...................... 10-2006-0085485

(51) Int. Cl.
*H01L 21/336* (2006.01)

(52) U.S. Cl. ................. 438/257; 438/266; 257/E21.001

(58) Field of Classification Search ................. 438/266, 438/257
See application file for complete search history.

(56) References Cited

U.S. PATENT DOCUMENTS

| 6,790,782 | B1 * | 9/2004 | Yang et al. ................... 438/706 |
| 7,396,725 | B2 * | 7/2008 | Kim ........................... 438/275 |
| 2006/0220144 | A1 * | 10/2006 | Anezaki et al. ............. 257/374 |

* cited by examiner

*Primary Examiner*—Jack Chen
(74) *Attorney, Agent, or Firm*—Sherr & Vaughn, PLLC

(57) ABSTRACT

Embodiments relate to a flash memory device and a method of manufacturing a flash memory device that may improve a reliability of process by obtaining a Depth of Focus (DOF) in an exposure process. In embodiments, a method may include sequentially stacking an oxide film, a floating gate poly film, an ONO film, a control gate poly film, and a BARC (Bottom AntiReflect Coating) on a semiconductor substrate, forming a photoresist pattern for a stack gate on the BARC, and etching the BARC, the control gate poly film, the ONO film and the floating gate poly film at once by using the photoresist pattern until the oxide film is exposed.

9 Claims, 3 Drawing Sheets

FLASH MEMORY DEVICE

The present application claims priority under 35 U.S.C. 119 and 35 U.S.C. 365 to Korean Patent Application No. 10-2006-0085485 (filed on Sep. 6, 2006), which is hereby incorporated by reference in its entirety.

BACKGROUND

A gate-coupling coefficient may be an important element in determining an efficiency of a memory cell in a flash memory device. The gate-coupling coefficient may have a substantial effect on an electric potential of a floating gate. In a flash memory device having a higher gate-coupling coefficient, the electric potential of the floating gate may be adjacent to a given electric potential of a control gate in the memory cell. Accordingly, performance of a flash memory cell may be improved, including programming and erasing efficiency and rapid reading speed.

The high gate-coupling rate may enable a simplification of chip design, and may lower an operation voltage of a flash memory cell to a lower power-source voltage. That is, an important element to determine the gate-coupling coefficient may be a capacitance between each polysilicon to a tunnel oxide capacitance, that is, a capacitance between a floating gate poly and a control gate poly. As the capacitance between each polysilicon increases and the tunnel oxide capacitance decreases, the gate coupling-coefficient may increase.

FIGS. 1A to 1C are cross section diagrams illustrating a related art method of manufacturing a flash memory device having a stack gate structure. The related art flash memory device may include semiconductor substrate 10, oxide film 11, floating gate poly film 12, ONO film 13, control gate poly film 14, Bottom AntiReflect Coating (BARC) 15, and photoresist pattern 16.

In the related art etching method, BARC 15 may be first etched using photoresist pattern 16 (as shown in FIG. 1B). Floating gate poly film 12, ONO film 13, and control gate poly film 14 may be subsequently etched (as shown in FIG. 1C).

In relation with the thickness of the stack gate of the related art flash memory device having a stack gate structure, control gate poly film 14, which may serve as a mask for ion implantation, may not be decreased in thickness if an ion-implantation condition is not changed on a decreased design rule. Thus, since a thickness of the film to be etched may not be decreased, it may be impossible to decrease the thickness of photoresist pattern 16 used as a mask in an etching process.

In this case, it may be necessary for the photoresist to maintain a thickness of 6000 Å at minimum. However, according to the decreased design rule, a pitch to form the stack gate, that is, a total value of line and critical dimension (CD) of space may also be decreased. Accordingly, it may be difficult to obtain a Depth of Focus (DOF) margin in an exposure process for the same thickness of the photoresist.

When patterning the photoresist of the stack gate, photoresist pattern 16 may be fallen or deformed. Also, even thought the photoresist pattern may be formed, its realization may be lowered and an efficiency of a flash memory device may deteriorate.

SUMMARY

Embodiments relate to a flash memory device and a method of manufacturing a flash memory device. Embodiments relate to a method of manufacturing a flash memory device that may improve the reliability of process by obtaining a Depth of Focus (DOF) in an exposure process.

Embodiments relate to a method of manufacturing a flash memory device that may improve the reliability of process by obtaining a Depth of Focus (DOF) margin in an exposure process.

According to embodiments, a method of manufacturing a flash memory device may include sequentially stacking an oxide film, a floating gate poly film, an ONO film, a control gate poly film, and a BARC (Bottom AntiReflect Coating) on a semiconductor substrate, forming a photoresist pattern for a stack gate on the BARC, and etching the BARC, the control gate poly film, the ONO film and the floating gate poly film at once by using the photoresist pattern until the oxide film is exposed.

DRAWINGS

DESCRIPTION

Figure 2A:
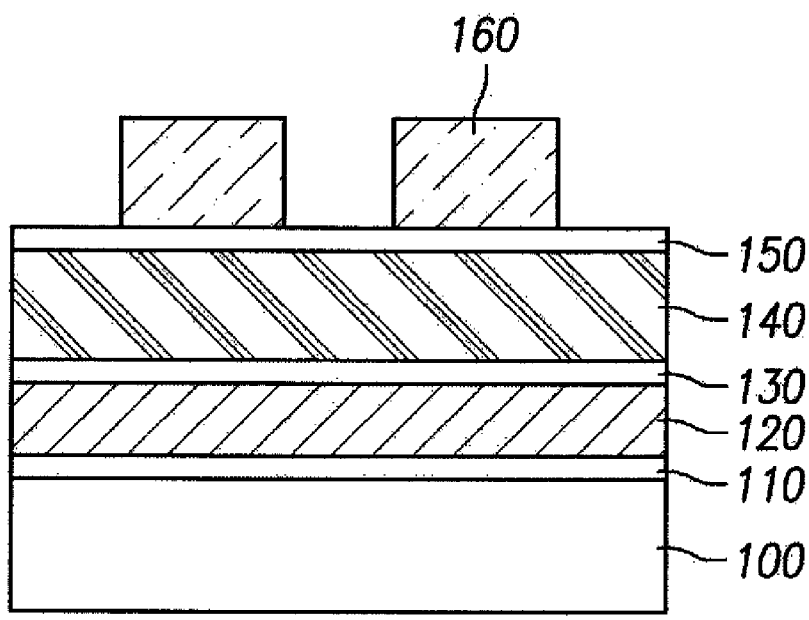
FIGS. 2A and 2B are cross section diagrams illustrating a flash memory device and a method of manufacturing a flash memory device according to embodiments.

Referring to FIG. 2A, oxide film 110, floating gate poly film 120, oxide-nitride-oxide (ONO) film 130, control gate poly film 140, and Bottom AntiReflect Coating (BARC) 150 may be sequentially stacked on semiconductor substrate 100. To form a stack gate, a photoresist for KrF may be coated at a thickness between approximately 4000 Å and 5000 Å.

Figure 1A:
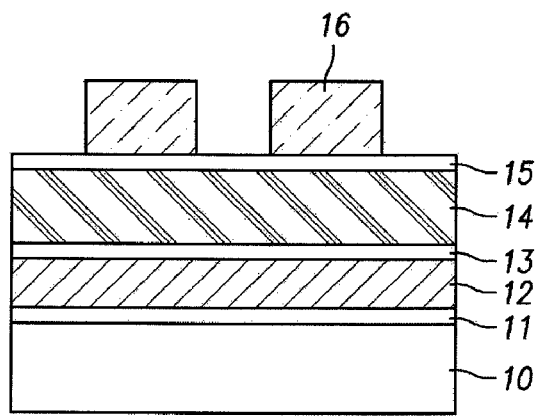
FIGS. 1A to 1C are cross section diagrams illustrating a method of manufacturing a flash memory device having a stack gate structure according to the related art.
Figure 1B:
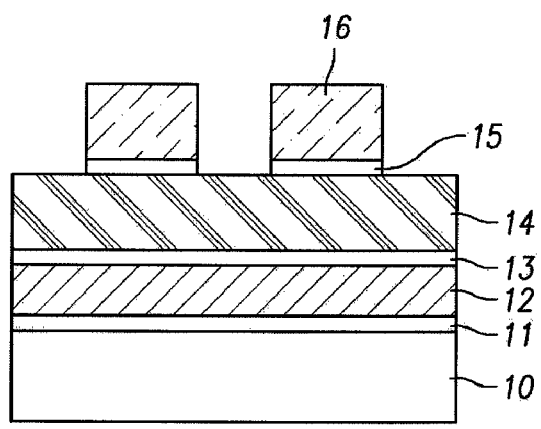
Figure 1C:
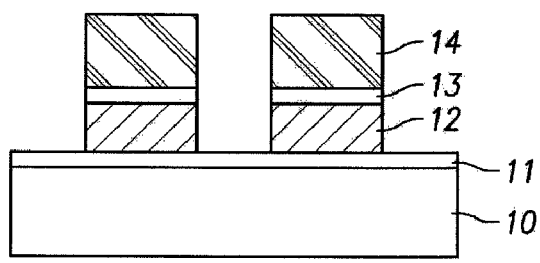

The photoresist for KrF may be patterned to form photoresist pattern for KrF 160. After obtaining a Depth of Focus (DOF) margin in an exposure process, BARC 150 and a stack gate film may be etched together, wherein the stack gate film may include floating gate poly film 120, ONO film 130, and control gate poly film 140. According to embodiments, the etching method may be different from the related art etching method which may first etch BARC 15 using photoresist pattern 16 (as shown in FIG. 1B) and may then etch floating gate poly film 12, ONO film 13, and control gate poly film 14 (as shown in FIG. 1C).

To carry out the etching process using photoresist pattern for KrF 160 as a mask, the etching process may be carried out until an amount of CO by-product may be used up as an end point. The process conditions may include an atmospheric pressure that may be 10~30 mT, a source power that may be 400~700 W, and a bias power that may be 40~150 W. The etching process may use $CF_4$ of 80~200 sccm, Ar of 100~200 sccm and $HeO_2$ of 10~20 sccm.

Figure 2B:
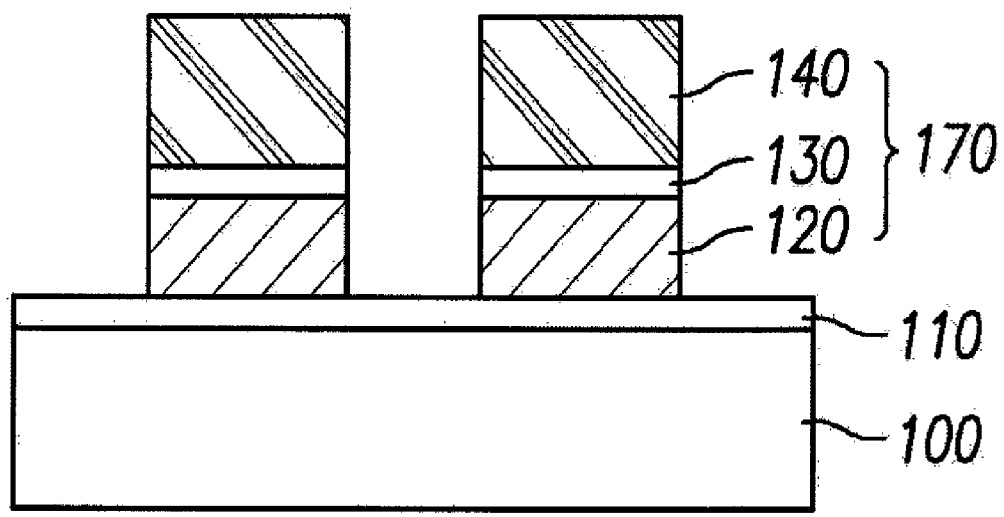
Figure 3:
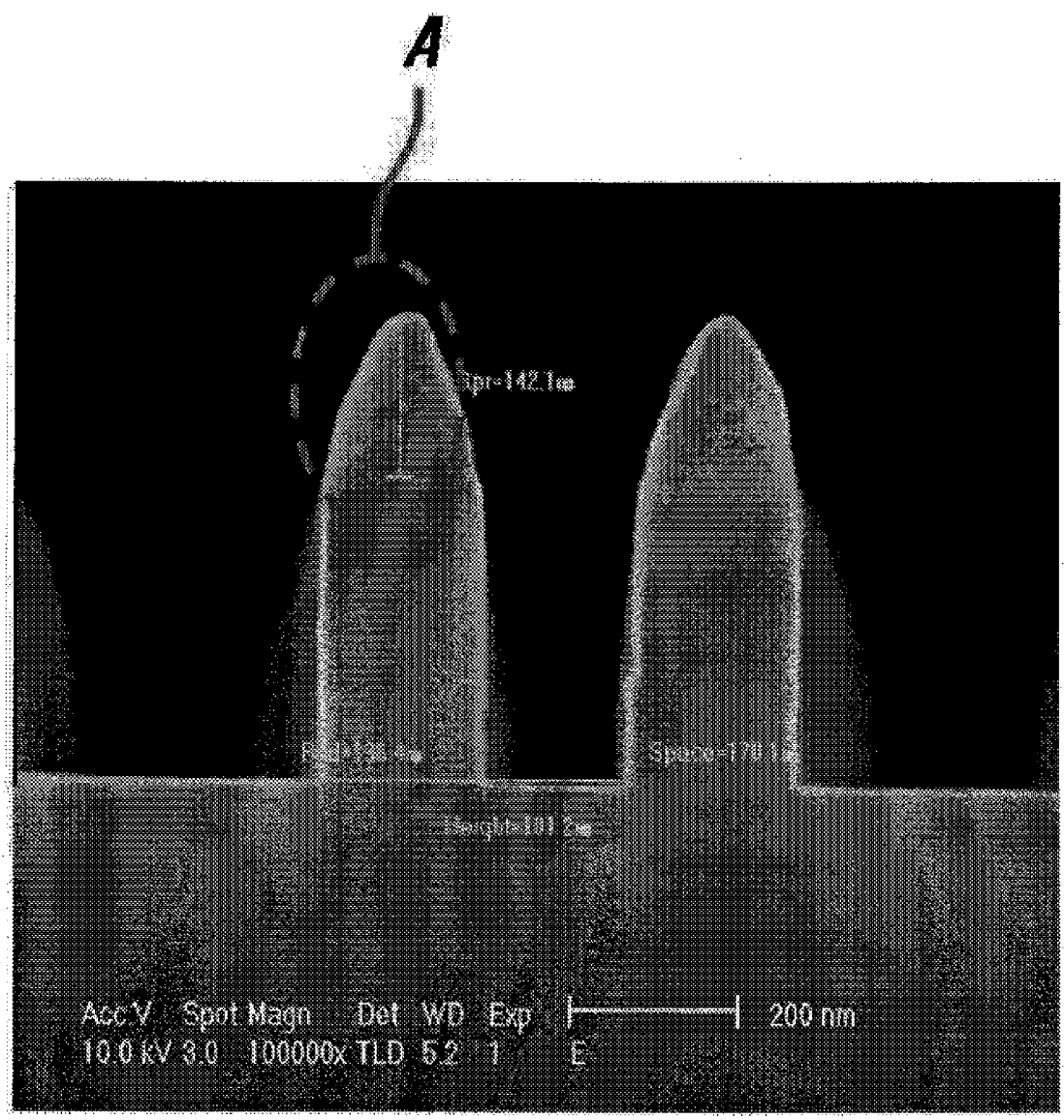
FIG. 3 is a Scanning Electron Microscope (SEM) cross section view after etching a stack gate according to embodiments.

Referring to FIG. 2B, oxide film 110 may be etched to be exposed. This may form stack gate 170 including oxide film 110, floating gate poly film 120, ONO film 130, and control gate poly film 140.

In embodiments, after performing the etching process under such conditions, remaining photoresist of "A" portion may have a thickness of approximately 1000 Å. In embodiments, the following process margin may require A thickness of about 200 Å and 300 Å in the photoresist. Hence, the remaining photoresist provided with the thickness of 1000 Å may ensure sufficient process margin. Also, the control gate profile may also be maintained at a predetermined thickness having the sufficient process margin.

In embodiments, the process of forming the control gate in the flash memory device, especially, the flash memory device having a half pitch of 130 nm or less, may use an In-site method where BARC 150 and the stack gate film inclusive of floating gate poly film 120, ONO film 130 and control gate poly film 140 may be etched at once, in a single etching process. Accordingly, stack gate 170 may be formed without the additional process and apparatus to etch BARC 150.

According to embodiments, stack gate 170 may be formed in the aforementioned process. Thus it may be possible to decrease a thickness of the photoresist that functions as the mask of the etching process. This may result in a fabrication condition that improves the DOF margin.

According to embodiments, the flash memory device and the method of manufacturing the flash memory device may have certain advantages.

For example, if the stack gate is formed using an in-situ method in the flash memory device having the half pitch of 130 nm or less, the fabrication yield may be improved and the DOF margin may be improved by decreasing the thickness of photoresist.

It will be apparent to those skilled in the art that various modifications and variations can be made to embodiments. Thus, it is intended that embodiments cover modifications and variations thereof within the scope of the appended claims. It is also understood that when a layer is referred to as being "on" or "over" another layer or substrate, it can be directly on the other layer or substrate, or intervening layers may also be present.

What is claimed is:

1. A method, comprising:
   sequentially stacking an oxide film, a floating gate poly film, an ONO film, a control gate poly film, and a Bottom AntiReflect Coating (BARC) over a semiconductor substrate;
   forming a photoresist pattern for a stack gate over the BARC; and
   etching the BARC, the control gate poly film, the ONO film, and the floating gate poly film in a single etching process using the photoresist pattern as a mask.

2. The method of claim 1, wherein the etching is performed until the oxide film is exposed.

3. The method of claim 2, wherein forming the photoresist pattern comprises:
   coating a photoresist at a thickness between 4000 Å and 5000 Å over the BARC; and
   forming the photoresist pattern by patterning the photoresist in a region for the stack gate.

4. The method of claim 3, wherein the photoresist pattern comprises a photoresist of KrF.

5. The method of claim 2, wherein the photoresist pattern comprises a photoresist of KrF.

6. The method of claim 2, wherein the etching process is performed using CF4 of 80~200 sccm, Ar of 100~200 sccm and HeO2 of 10~20 sccm, with an atmospheric pressure of 10~30 mT, a source power of 400~700 W, and a bias power of 40~150 W.

7. The method of claim 2, wherein the etching process is performed by an in-situ method to the oxide film over the semiconductor substrate.

8. The method of claim 2, further comprising obtaining a Depth of Focus (DOF) margin in an exposure process after forming the photoresist pattern, wherein the etching process is carried out after obtaining the DOE margin.

9. The method of claim 1, wherein the etching process performed until an amount of CO by-product is depleted.

* * * * *